United States Patent [19]
Yamashita et al.

[11] Patent Number: 5,981,863
[45] Date of Patent: *Nov. 9, 1999

[54] PROCESS OF MANUFACTURING THERMOELECTRIC REFRIGERATOR ALLOY HAVING LARGE FIGURE OF MERIT

[75] Inventors: Hiroyuki Yamashita; Yuma Horio; Toshiharu Hoshi, all of Shizuoka, Japan

[73] Assignee: Yamaha Corporation, Japan

[*] Notice: This patent is subject to a terminal disclaimer.

[21] Appl. No.: 08/610,165

[22] Filed: Feb. 29, 1996

[30] Foreign Application Priority Data

Mar. 3, 1995 [JP] Japan .................................. 7-070586

[51] Int. Cl.$^6$ .................................................. H01L 35/34
[52] U.S. Cl. ........................ 136/201; 136/238; 136/240; 419/48
[58] Field of Search .............................. 136/201, 236.1, 136/238, 240; 423/508; 252/62.3 T; 419/23, 48, 49

[56] References Cited

U.S. PATENT DOCUMENTS

| | | | |
|---|---|---|---|
| 3,129,117 | 4/1964 | Harding, Jr. et al. | 136/201 |
| 3,228,805 | 1/1966 | Waseleski, Jr. et al. | 148/2 |
| 3,268,330 | 8/1966 | Kendall, Jr. et al. | 75/226 |
| 4,588,520 | 5/1986 | Jayadev et al. | 252/512 |
| 4,764,212 | 8/1988 | Okumura | 75/228 |
| 4,902,648 | 2/1990 | Ohta et al. | 136/200 |
| 5,726,381 | 3/1998 | Horio et al. | 136/236.1 |
| 5,763,293 | 6/1998 | Yamashita et al. | 136/210 |

FOREIGN PATENT DOCUMENTS

| | | |
|---|---|---|
| 63-36583 | 2/1988 | Japan . |
| 64-77184 | 3/1989 | Japan . |

*Primary Examiner*—Kathryn L. Gorgos
*Assistant Examiner*—Thomas H. Parsons
*Attorney, Agent, or Firm*—Ostrolenk, Faber, Gerb & Soffen, LLP

[57] ABSTRACT

Molten thermoelectric alloy expressed as $(Bi, Sb)_2(Te, Se)_3$ is rapidly cooled at $10^4$ to $10^{6°}$ K/second so as to crystallize the thermoelectric alloy, and powder of the thermoelectric alloy is hot pressed under the pressure equal to or greater than 400 kgf/cm$^2$ at 200 degrees to 400 degrees in centigrade for a time period between $\{(-T/5)+90\}$ minutes and 150 minutes or at 400 degrees to 500 degrees in centigrade for a time period between 5 minutes and 150 minutes so as to increase the figure of merit by virtue of the strain left in the crystal and/or micro crystal grain.

11 Claims, 9 Drawing Sheets

Fig. 9

PROCESS OF MANUFACTURING THERMOELECTRIC REFRIGERATOR ALLOY HAVING LARGE FIGURE OF MERIT

FIELD OF THE INVENTION

This invention relates to a thermoelectric refrigerating alloy and, more particularly, to a process of manufacturing a thermoelectric refrigerating alloy having a large figure of merit.

DESCRIPTION OF THE RELATED ART

When different materials form a loop, two thermojunctions take place. If one of the thermojunctions is heated and the other is cooled, thermoelectric current flows through the loop due to the temperature difference between the two thermojunctions. This phenomenon is known as the "Seebeck effect".

When electric current flows across the thermojunctions, an exoergic phenomenon and an endoergic phenomenon take place the at two junctions, respectively, and are known as the "Peltier effect".

When current flows through a conductive path of a, homogeneous material gradient in temperature, the endoergic phenomenon or the exoergic phenomenon takes place in the homogeneous material, and the phenomenon is known as the "Thomson effect".

The Seebeck effect, the Peltier effect and the Thomson effect are reversible reactions categorized in the thermoelectric phenomenon. On the other hand, the Joule effect and the thermal conduction are irreversible phenomena, and these reversible and irreversible phenomena are available for thermoelectric refrigeration.

A typical example of the thermoelectric material is the alloy containing one or two elements selected from the first group consisting of Bi and Sb and one or two elements selected from the second group consisting of Te and Se, and the atomic ratio between the first group and the second group is adjusted to 2:3. Therefore, the prior art alloy is expressed as $(Bi, Sb)_2(Te, Se)_3$. The prior art thermoelectric material is broken down into nine systems, i.e., B-Te system, Bi-Se system, Sb-Te system, Sb-Se system, Bi-Sb-Te system, Bi-Sb-Se system, Bi-Te-Se system, Sb-Te-Se system and Bi-Sb-Te-Se system.

The figure of merit z represents the thermoelectric characteristics of the thermoelectric refrigerating material or a thermo-electric converting element, and is expressed by Equation 1.

$$z = alpha^2\ sigma/kappa \qquad \text{Equation 1}$$

where alpha is the Seebeck coefficient, sigma is the electric conductivity and kappa is the heat conductivity. A thermoelectric material with a large figure of merit is superior to another thermoelectric material with a small figure of merit.

The prior art thermoelectric material is produced as follows. First, Bi and/or Sb and Te and/or Se are scaled, and are mixed in the composition. Heat is applied, and the mixture is melted. The ingot is powdered, and the powder is sintered so as to solidify into a piece of the thermoelectric material.

A problem is encountered in the prior art thermoelectric material produced through the above described process in that the figure of merit does not exceed $3.3 \times 10^{-3}/°K$.

SUMMARY OF THE INVENTION

It is therefore an important object of the present invention to provide a process of producing a thermoelectric material the figure of merit of which is greater than $3.3 \times 10^{31\ 3}/°K$.

The present inventors contemplated the problem inherent in the prior art piece of thermoelectric material, and noticed that the crystal grains were large. The heat conductivity was decreased together with the crystal grain size, and, accordingly, the figure of merit was increased by decreasing the crystal grain size. Therefore, the present inventors concluded that the heat treatment was controlled in such a manner as to restrict the crystal grain.

The present invention proposes to shape powder of thermoelectric material of micro-grains, amorphous phase or non-equilibrium phase without recrystallization.

In accordance with one aspect of the present invention, there is provided a process of manufacturing a thermoelectric element, comprising the steps of: a) preparing a molten thermoelectric alloy containing at least one first element selected from the group consisting of bismuth and antimony and at least one second element selected from the group consisting of tellurium and selenium; b) rapidly cooling the molten thermoelectric alloy so as to solidify the thermoelectric alloy; c) powderizing the solidified thermoelectric alloy; and d) shaping the powder of the thermoelectric alloy into a configuration by using a hot pressing under the conditions that, when a temperature ranges from 200 degrees to 400 degrees in centigrade, a pressure equal to or greater than 400 $kgf/cm^2$ is applied to the powder of the thermoelectric alloy for a first time expressed as $(-T/5)+90 \leq t \leq 150$ where T is the temperature and t is the first time in minutes, when the temperature is higher than 400 degrees in centigrade but not higher than 500 degrees in centigrade, the pressure is applied to the powder of the thermoelectric alloy for a second time ranging between 5 minutes to 150 minutes.

In accordance with another aspect of the present invention, there is provided a process of manufacturing a thermoelectric element, comprising the steps of: a) preparing a molten thermoelectric alloy containing at least one first element selected from the group consisting of bismuth and antimony and at least one second element selected from the group consisting of tellurium and selenium; b) rapidly cooling the molten thermoelectric alloy so as to solidify the thermoelectric alloy; c) powderizing the solidified thermoelectric alloy; and d) shaping the powder of the thermoelectric alloy into a configuration by a sintering at a temperature lower than a temperature for recrystallization of the thermoelectric alloy.

The rapid cooling causes the solid thermoelectric alloy to be extremely small in grain size, amorphous or a non-equilibrium phase with a structural strain. When the powder made from the solid thermoelectric alloy is hot pressed or sintered without recrystallization, the small grain size or the structural strain is maintained in a thermoelectric element shaped into the configuration, and, accordingly, the thermoelectric element is small in thermal conductivity. This results in a large figure of merit.

In detail, the thermal conductivity K of a substance is expressed by equation 2.

$$K = -(1/3)CvL(dt/dx) \qquad 2$$

where C is the specific heat of the substance, v is a mean particle velocity, L is a mean free path of phonon and dt/dx is the temperature gradient. When the thermoelectric material is amorphous, the mean free path L of phonon is small, and causes the thermal conductivity to be small. As a result, the figure of merit Z is increased.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENT

Powder of bismuth and/or antimony and powder of tellurium and/or selenium are scaled, and are mixed into a composition of $(Bi, Sb)_2(Te, Se)_3$. Thus, the mixture for thermoelectric material is prepared.

Subsequently, the mixture for thermoelectric material is melted, and the molten thermoelectric material is rapidly cooled by using a melt quenching technique at $10^4$ to $10^{6\circ}$ K/second. A single rolling process, a double rolling process or a gas atomizing process is available for the rapid quenching. When the molten thermoelectric material is subjected to melt quenching, laminae of the thermoelectric material are obtained.

Subsequently, the laminae are powdered. The average grain size or the mean diameter of the thermoelectric material is equal to or less than 300 microns.

The powder of thermoelectric material is hot pressed into a predetermined configuration. Alternatively, sintering is available instead of the hot pressing.

If hot pressing is used for forming a thermoelectric element, the conditions are as follows. Pressure equal to or greater than 400 kgf/cm$^2$ is applied to the powder of thermoelectric material, and is maintained at a temperature T for a time period t. When the temperature T ranges between 200 degrees to 400 degrees centigrade, i,e., $200 \leq T \leq 400$, the time period t falls within the range expressed by inequality 1.

$$-T/5+90 \leq t \leq 150 \qquad \text{Inequality 1}$$

When the temperature T is higher than 400 degrees in centigrade but not higher than 500 degrees in centigrade, i.e., $400 \leq T \leq 500$, the time period t satisfies inequality 2.

$$5 \leq t \leq 150 \qquad \text{Inequality 2}$$

Figure 1:
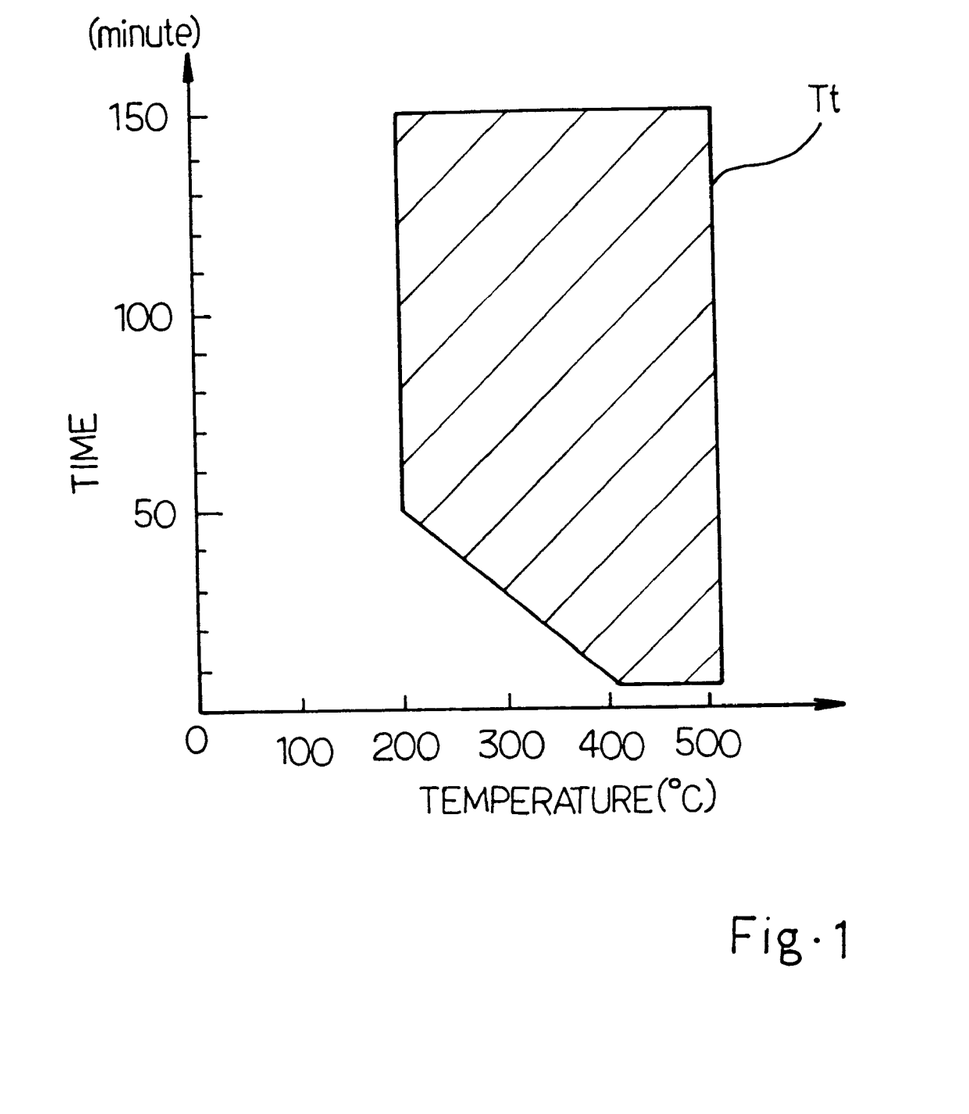
FIG. 1 is a graph showing a relation between temperature and time in a hot pressing according to the present invention.

In inequalities 1 and 2, the time period t is in minutes, and FIG. 1 illustrates the relation between the temperature T and the time period t. The time/temperature conditions according to the present invention are indicated by the hatched region Tt in FIG. 1.

When the hot pressing is carried out under the above described conditions, the powder is not recrystallized, and the grain size is as small as the powder made from the laminae. The density is maintained high. Thus, the thermoelectric material fabricated through the process according to the present invention is small in grain size. As described hereinbefore, the small grain size decreases the thermal conductivity of the thermoelectric material, and inversely increases the figure of merit.

When the powder is shaped into the thermoelectric element by sintering, the powder is sintered at lower than a temperature for recrystallization of the thermoelectric material. In this instance, the powder is sintered at 400 degrees centigrade or less. The sintered product is also small in grain size, and is small in thermal conductivity. As a result, the figure of merit is enlarged.

Figure 2:
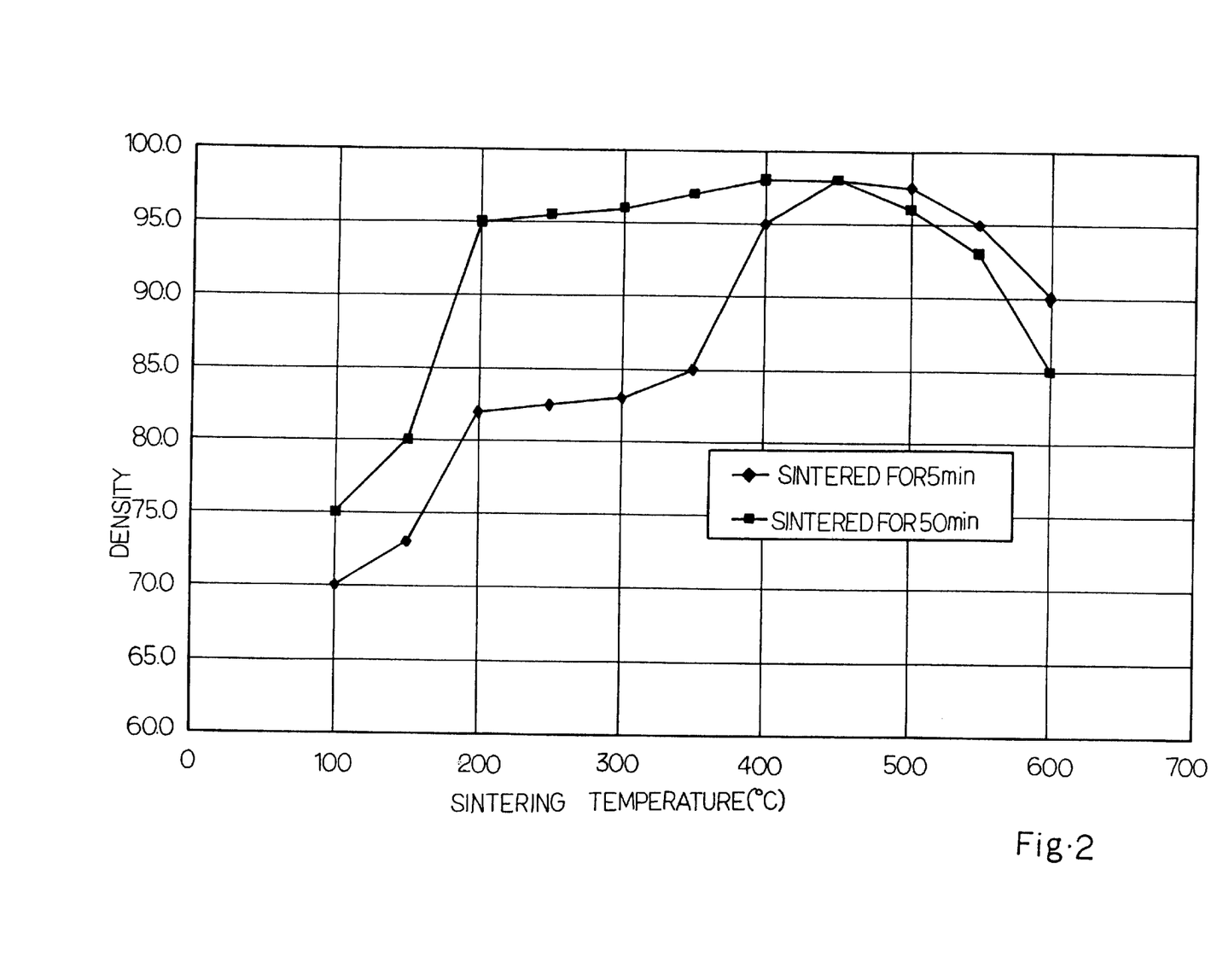
FIG. 2 is a graph showing relation between a sintering temperature and a density achieved under 400 kgf/cm$^2$.

FIG. 2 illustrates the relation between a sintering temperature and a density achieved under 400 kgf/cm$^2$. If the sintering is carried out within the scope of the present invention, the density is less than 95 percent, and the sintered product is very brittle. Such a brittle sintered product is not available for a Peltier element.

Figure 3:
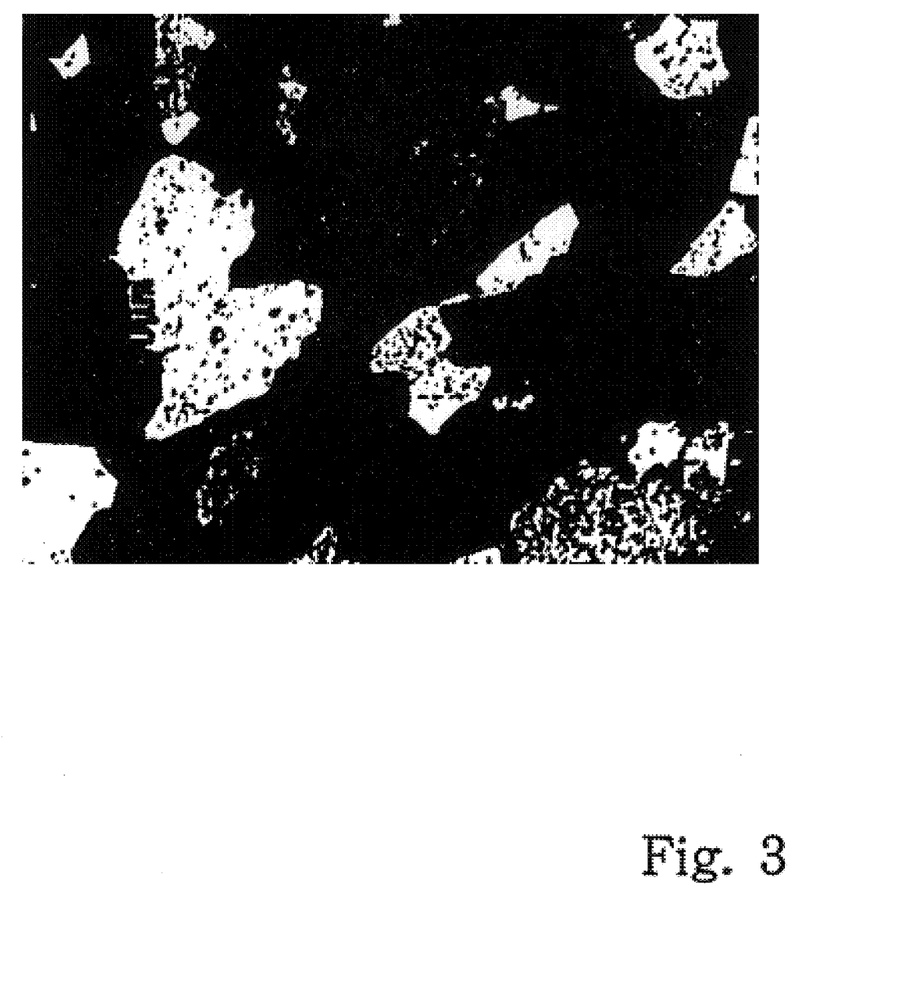
FIG. 3 is a photo-copy of a microphotograph showing the crystal structure sintered at 500 degrees in centigrade for 180 minutes.

FIG. 3 is a photo-copy of a microphotograph showing the crystal structure sintered at 500 degrees in centigrade for 180 minutes. When the hot pressing is carried out within the scope of the present invention, the crystal grains are enlarged. As a result, the thermal conductivity exceeds 1.5 watt/mk°, and the figure of merit is decreased under $2.0 \times 10^{-3}/K°$.

The crystal structure of the thermoelectric material is dependent on the quenching velocity and the composition. If the quenching velocity and the composition are appropriately selected, the thermoelectric material becomes amorphous or non-equilibrium, and the amorphous thermoelectric material or the non-equilibrium thermoelectric material also achieves a small thermal conductivity and, accordingly, a large figure of merit.

When the quenching velocity is higher, the thermoelectric material tends to be amorphous. The amorphous thermoelectric material is also powdered and, thereafter, solidified into a thermoelectric element. The thermoelectric element does not have grain boundaries, and, for this reason, no microphotograph is incorporated in the drawings.

The crystal structure obtained at the above quenching velocity is non-equilibrium, and the term "non-equilibrium" means thermodynamically unstable state.

If the quenching velocity is lower than $10^{4\circ}$ K/second, not only the amorphous phase but also the high-density strained crystal structure are never obtained, and the figure of merit is small. On the other hand, the quenching velocity over $10^{6\circ}$ K/second is presently impossible. For this reason, the present inventor sets the limitation on the quenching velocity.

The present inventors compared a prior art thermoelectric material with thermoelectric materials, of the present invention, and took microphotographs.

The prior art thermoelectric material was expressed by the composition formula of $Bi_2Te_3$, and was shaped by using a hot pressing under the conditions of 500 kgf/cm$^2$ at 550 degrees in centigrade for 10 minutes. The temperature was higher than the temperature range according to the present invention. The thermal conductivity was 1.36 watt/m °K, and FIG. 4 was the microphotograph of the crystal structure.

The first specimen of the present invention was expressed by the composition formula of $Bi_{0.5}Sb_{1.5}Te_3$, and was hot pressed under the conditions of 8000 kgf/cm$^2$ at 450 degrees in centigrade for 10 minutes. The conditions fell within the scope of the present invention. The thermal conductivity was 1.08 watt/m °K, and FIG. 5 was the microphotograph of the crystal structure of the first specimen.

The second specimen of the present invention was also expressed by the composition formula of $Bi_{0.5}Sb_{1.5}Te_3$, and was hot pressed under the conditions of 8000 kgf/cm² at 350 degrees in centigrade for 80 minutes. The thermal conductivity was 0.93 watt/m °K, and FIG. 6 was the microphotograph showing the crystal structure of the second specimen.

Figure 4:
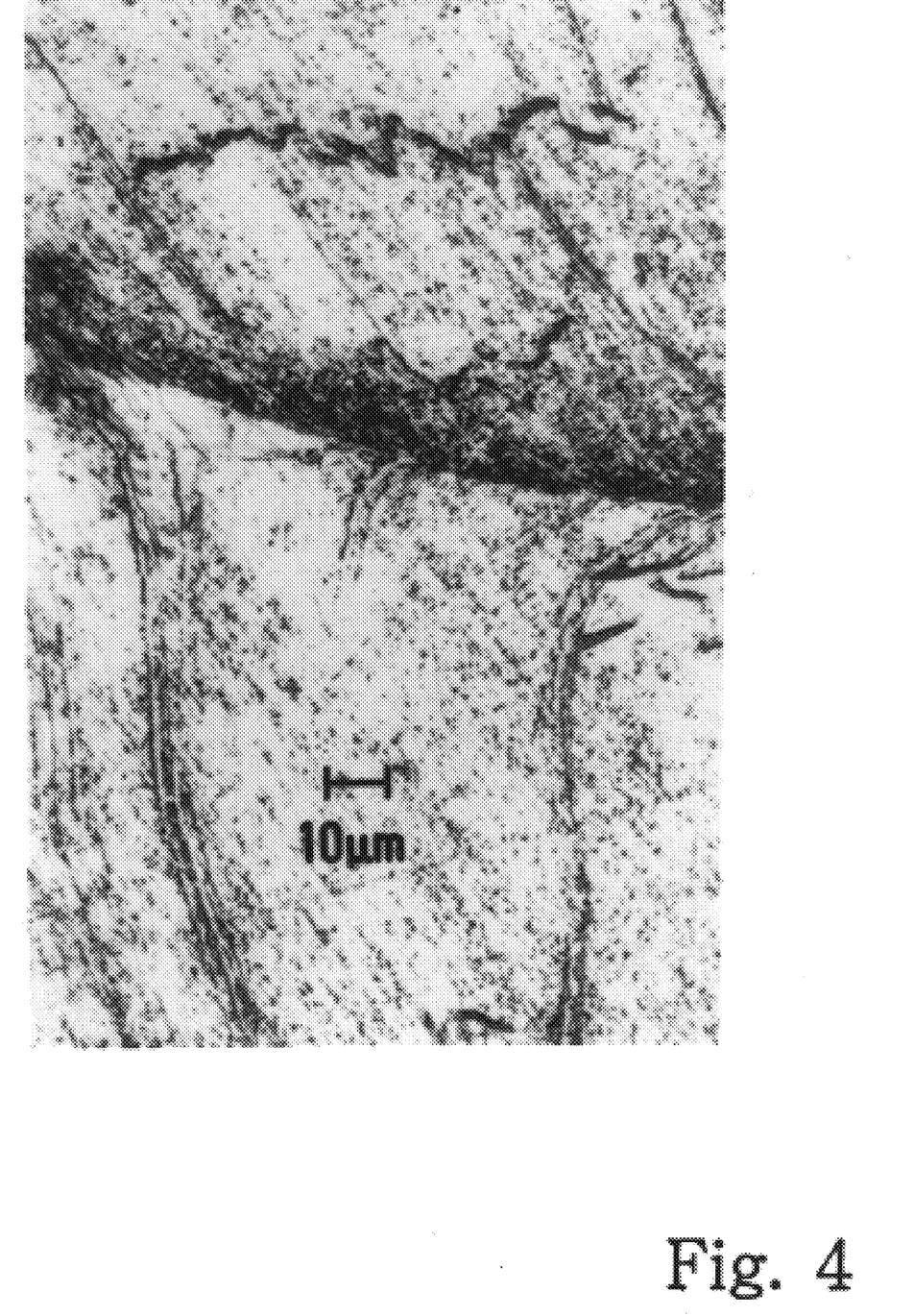
FIG. 4 is a microphotograph showing the crystal structure of a prior art thermoelectric material.
Figure 5:
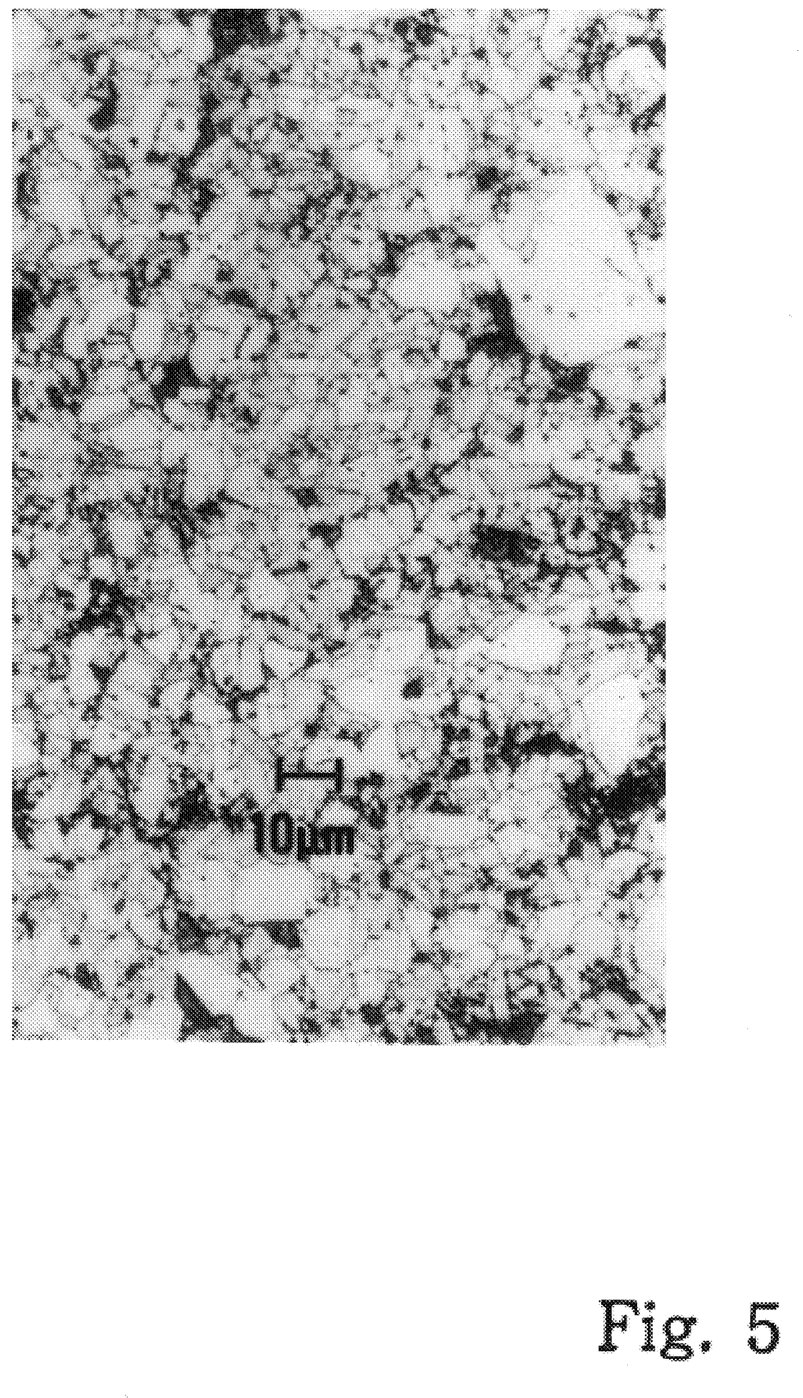
FIG. 5 is a microphotograph showing the crystal structure of a thermoelectric material according to the present invention.
Figure 6:
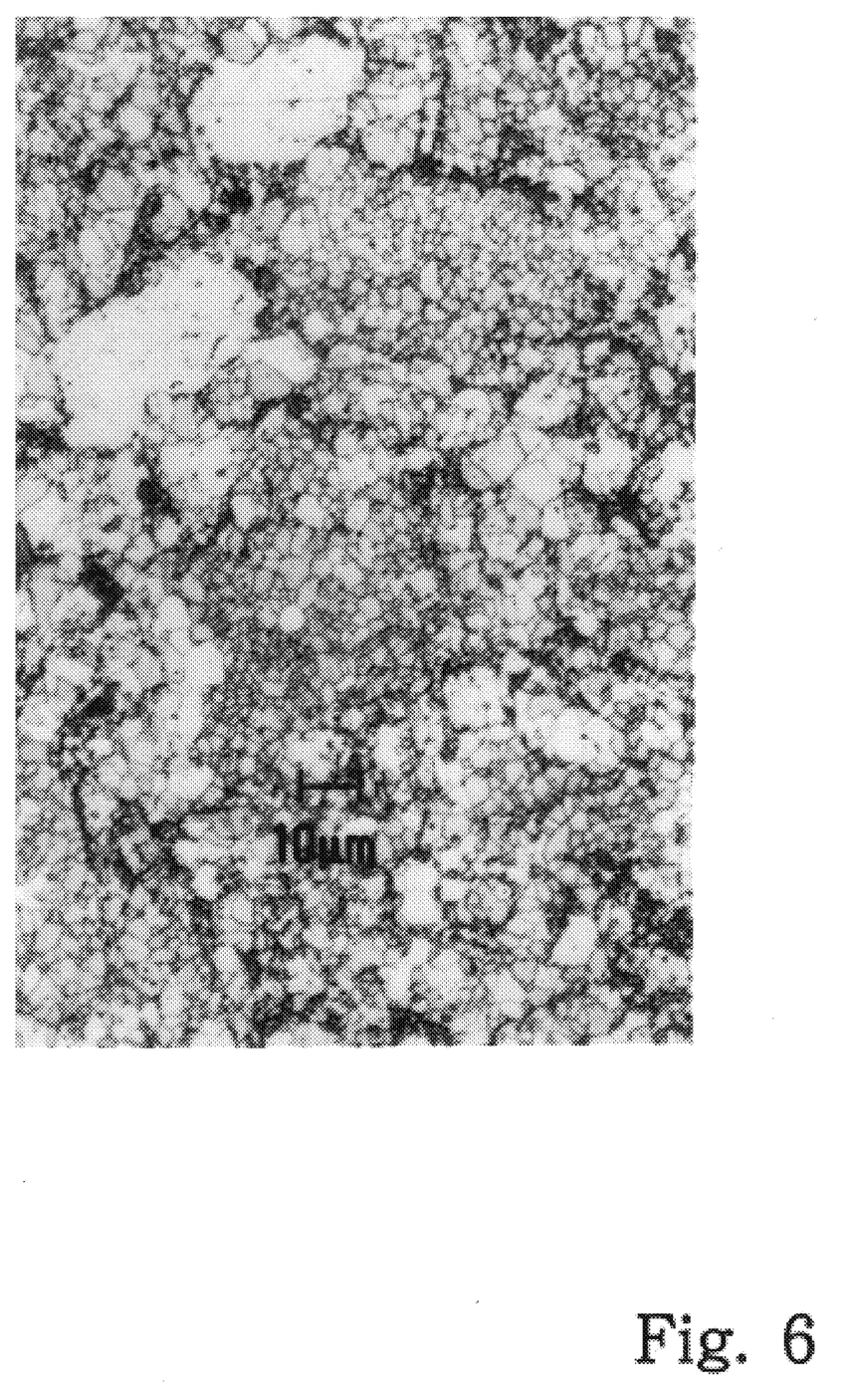
FIG. 6 is a microphotograph showing the crystal structure of another thermoelectric material according to the present invention.
Figure 7:
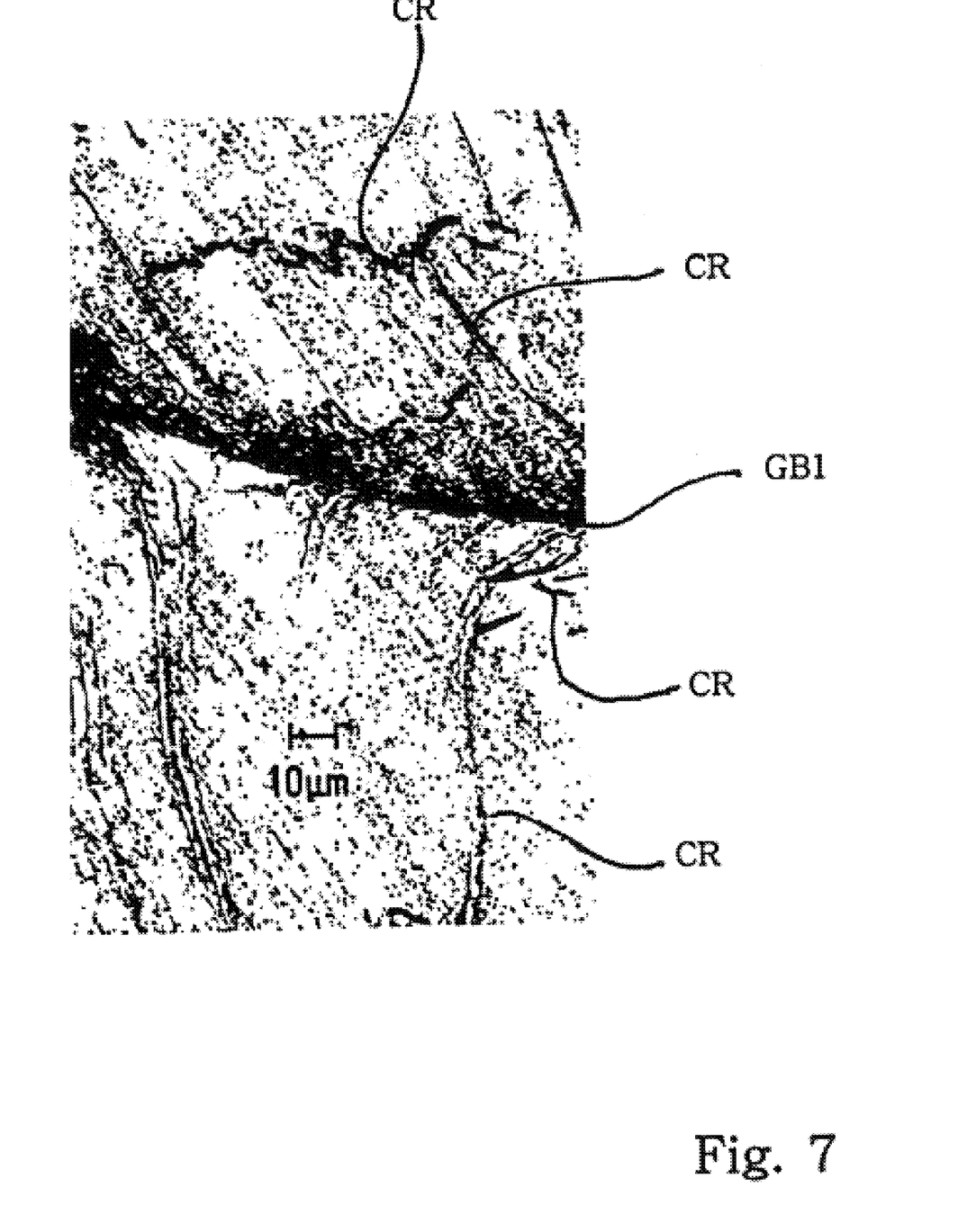
FIG. 7 is a photo-copy of the microphotograph showing the crystal structure shown in FIG. 4.
Figure 8:
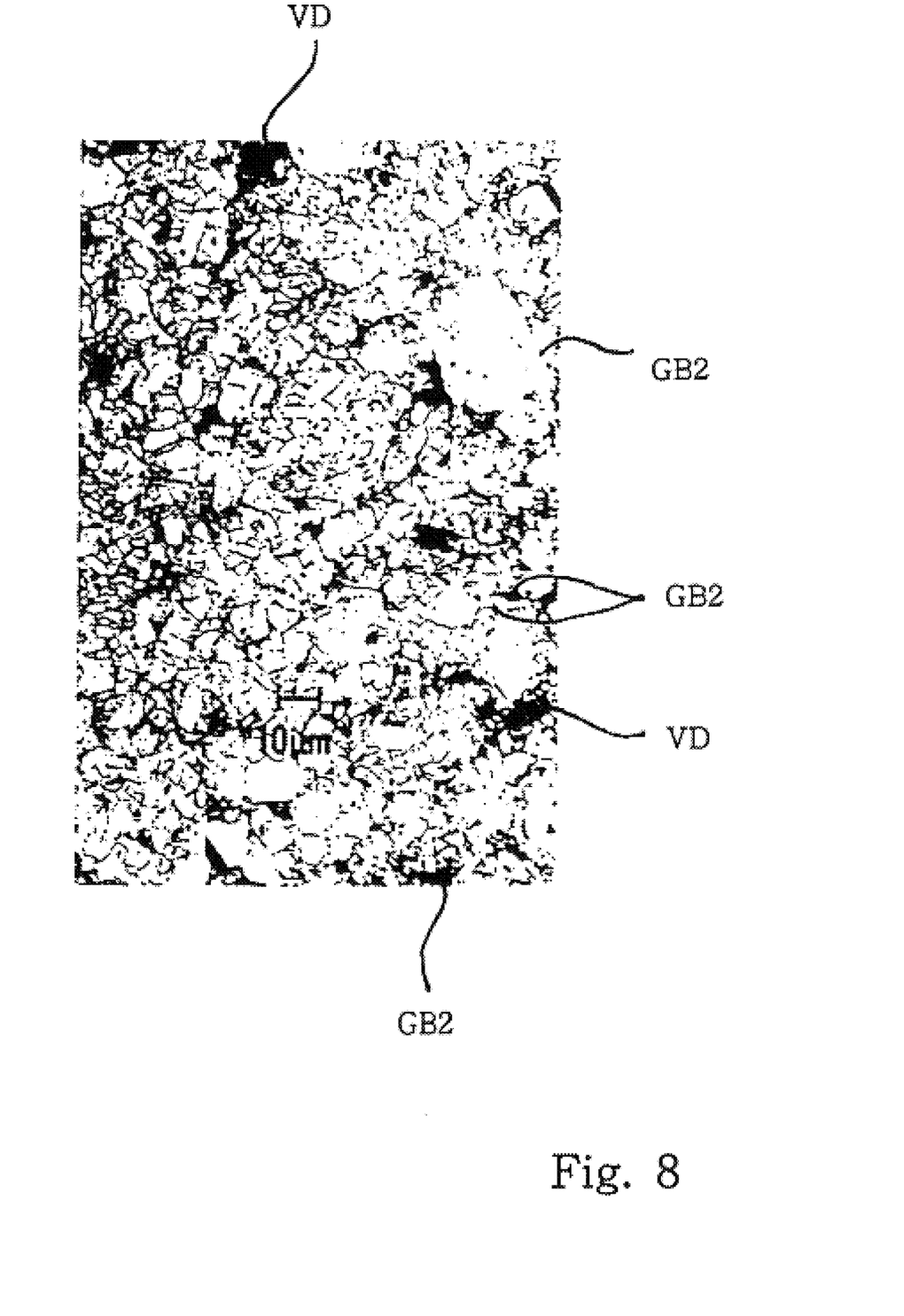
FIG. 8 is a photo-copy of the microphotograph showing the crystal structure shown in FIG. 5.
Figure 9:
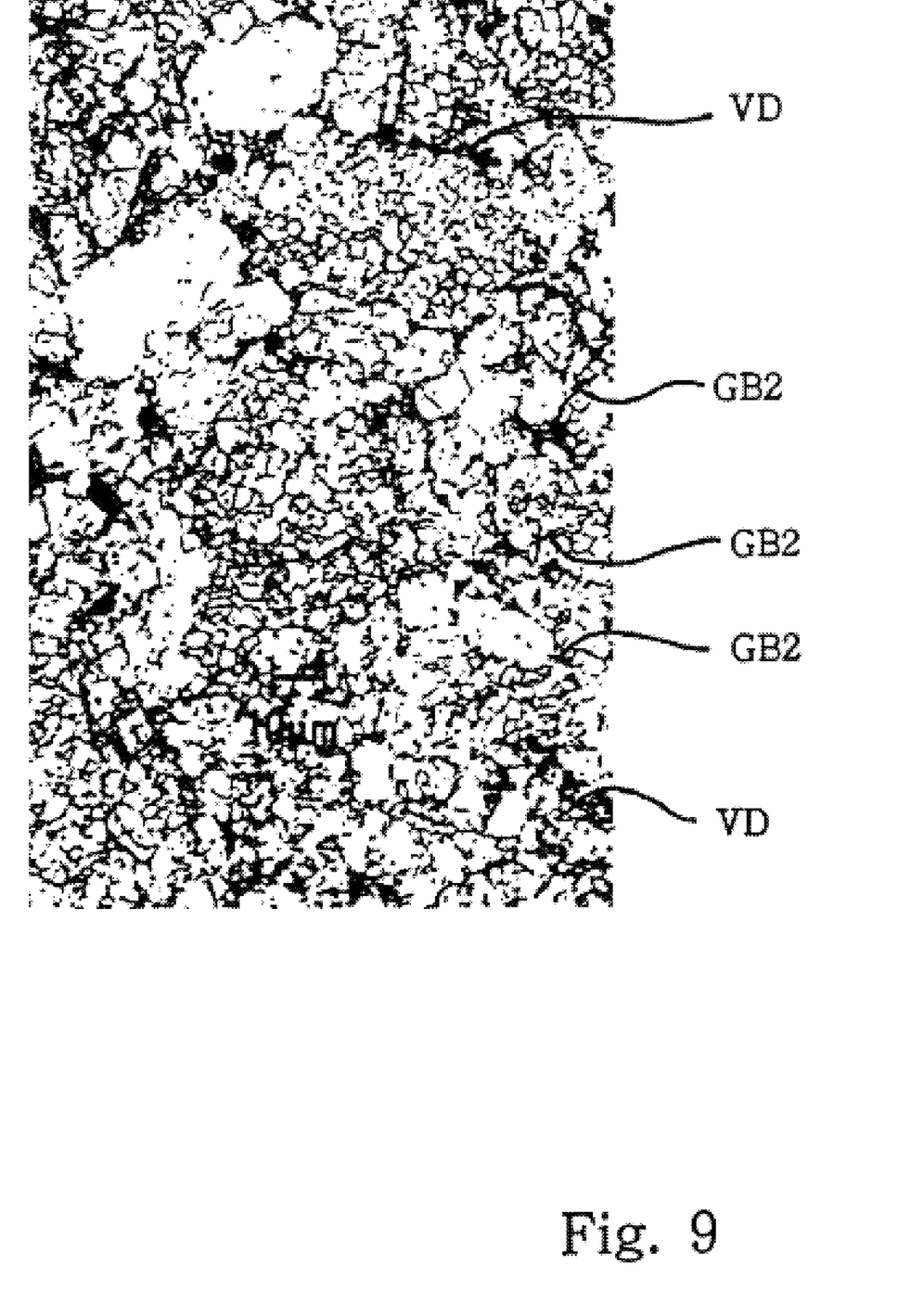
FIG. 9 is a photo-copy of the microphotograph showing the crystal structure shown in FIG. 6.

FIGS. 7, 8 and 9 are corresponding to FIGS. 4, 5 and 6, respectively, and are equal in magnification ratio. The grain was so large that FIG. 7 could not show the grain configuration. However, cracks CR took place in the prior art thermoelectric material, and a grain boundary GB1 was clear.

On the other hand, the grain size of the first and second specimens was sub-micron, and the small grains were of the order of 20 microns. The first and second specimens had been treated with etching solution before the observation, and voids VD took place in the crystal structures due to the over-etching. The grain boundaries were seen in FIGS. 8 and 9, are labeled with GB2. However, no crack took place in the first and second specimens.

Comparing FIGS. 5/8 and 6/9 with FIG. 4/7, it is understood that the crystal grains of the first and second specimens are much smaller than the crystal grain of the prior art thermoelectric material. The grain boundaries GB2 between the miniature crystal grains decrease the mean free path of phonon, and the thermal conductivity of the first and second specimens is surely smaller than the thermal conductivity of the prior art thermoelectric material because of the small crystal grain. This results in a large figure of merit.

However, if the resistivity is increased, the resistivity cancels the decrement of the thermal conductivity. In order to suppress the resistivity, it is necessary to keep the grain boundaries GB2 clean, i.e.,, contaminant and oxides are removed from the grain boundaries GB2. The clean and micro-crystal grains are formed by using the melt quenching technique.

The present inventors changed the composition and the conditions of hot pressing, and measured the average grain size, i.e., the mean diameter in micron and the thermal conductivity at room temperature. Table reports the mean diameter, the thermal conductivity, the conditions of hot pressing and the figure of merit.

Specimens 1 and 2 are the first specimen and the second specimen described hereinbefore. Specimens 1 to 10 fall under the scope of the present invention. However, specimens 11 to 16 were out of the technical scope of the present invention.

TABLE

| Specimen | Composition | Mean dia. micro meter | Thermal conduc. w/mk | Hot press ° C. × min. | Figure of merit $10^{-3}$/k |
|---|---|---|---|---|---|
| 1 | $Bi_{0.5}Sb_{1.5}Te_3$ | 4.4 | 1.08 | 450 × 10 | 4.3 |
| 2 | " | 1.2 | 0.93 | 350 × 80 | 4.1 |
| 3 | $Bi_2Te_3$ | 4.8 | 1.20 | " | 3.2 |
| 4 | $Bi_{0.5}Sb_{1.5}Te_{2.9}$ (Se) | 1.1 | 1.12 | " | 3.8 |
| 5 | $Bi_{0.5}Sb_{1.5}Te_{2.8}$ (Se) | 1.2 | 1.20 | " | 3.8 |
| 6 | $BiSbTe_3$ ($PbI_2$) | 1.0 | 1.20 | " | 3.7 |
| 7 | $Bi_2Te_{2.85}$ (Se) | 1.7 | 1.28 | " | 3.5 |
| 8 | $Bi_{0.8}Sb_{0.2}Te_{2.5}$ (Se) | 1.5 | 1.20 | " | 3.7 |
| 9 | $Bi_2Te_{2.85}$ (Se) | 1.9 | 1.20 | " | 3.6 |
| 10 | $Bi_{1.8}Sb_{0.2}Te_{2.85}Se_{0.15}(SbI_3)$ | 0.9 | 1.28 | " | 3.4 |

TABLE-continued

| Specimen | Composition | Mean dia. micro meter | Thermal conduc. w/mk | Hot press ° C. × min. | Figure of merit $10^{-3}$/k |
|---|---|---|---|---|---|
| 11 | $Bi_{0.5}Sb_{1.5}Te_3$ | 60 | 1.47 | 530 × 10 | 2.0 |
| 12 | " | 250 | 1.88 | 530 × 180 | 1.7 |
| 13 | " | | * | 180 × 180 | — |
| 14 | $Bi_2Te_3$ | 65 | 1.51 | 530 × 10 | 1.9 |
| 15 | " | 300 | 1.95 | 530 × 180 | 1.8 |
| 16 | " | | * | 180 × 180 | — |

In the table, * means that solidification is impossible. As will be understood from Table 1, the thermoelectric materials, i.e., specimens 1 to 10 according to the present invention are small in thermal conductivity by virtue of the small grain size, the amorphous phase and/or the non-equilibrium phase with strain, and, accordingly, achieve the large figure of merit ranging from $3.2 \times 10^{-3}$/°K to $4.3 \times 10^{-3}$/°K. However, the prior art thermoelectric materials, i.e., specimens 11 to 16 are large in thermal conductivity, and the figure of merit ranges from $1.7 \times 10^{-3}$/°K to $2.0 \times 10^{-3}$/°K.

Although particular embodiments of the present invention have been shown and described, it will be obvious to those skilled in the art that various changes and modifications may be made without departing from the spirit and scope of the present invention.

What is claimed is:

1. A process of manufacturing a thermoelectric element, comprising the steps of:
    a) preparing a molten thermoelectric alloy containing at least one first element selected from the group consisting of bismuth and antimony and at least one second element selected from the group consisting of tellurium and selenium;
    b) cooling said molten thermoelectric alloy so as to solidify said thermoelectric alloy;
    c) powderizing the solidified thermoelectric alloy; and
    d) shaping the powder of said thermoelectric alloy into a configuration by hot pressing under the conditions that when a temperature ranges from 200 degrees to 400 degrees centigrade, a pressure equal to or greater than 400 kgf/cm² is applied to said powder of said thermoelectric alloy for a first time expressed as $(-T/5)+90 \leq t \leq 150$ where T is said temperature and t is said first time in minutes,
    when said temperature is higher than 400 degrees centigrade but not higher than 500 degrees centigrade, said pressure equal to or greater than 400 kgf/cm² is applied to said powder of said thermoelectric alloy for a second time ranging between 5 minutes to 150 minutes.

2. The process as set forth in claim 1, in which the rapid cooling at said step b) is carried out under a quenching velocity ranging from $10^{4°}$ K per second to $10^{6°}$ K per second.

3. The process as set forth in claim 2, in which said quenching velocity is achieved by using a melt quenching technique.

4. The process as set forth in claim 1, in which said powder of said solidified thermoelectric material is equal to or less than 300 microns in mean diameter.

5. The process as set forth in claim 1, in which said at least one first element is bismuth and antimony, and said at least one second element is selenium and tellurium, the sintering being carried out at not greater than 400 degrees centigrade in said step d).

6. A process of manufacturing a thermoelectric element, comprising the steps of:
   a) preparing a molten thermoelectric alloy consisting essentially of at least one first element selected from the group consisting of bismuth and antimony and at least one second element selected from the group consisting of tellurium and selenium, the atomic ratio between said first element and said second element ranging between 2:2:28 and 2:3;
   b) cooling said molten thermoelectric alloy so as to solidify said thermoelectric alloy;
   c) powdering the solidified thermoelectric alloy; and
   d) shaping the powder of said thermoelectric alloy into a configuration by sintering at a temperature lower than a temperature for recrystallization of said thermoelectric alloy.

7. The process as set forth in claim 6, in which said powder of said solidified thermoelectric material is equal to or less than 300 microns in mean diameter.

8. A process of manufacturing a thermoelectric element, comprising the steps of:
   a) preparing a molten thermoelectric alloy containing at least one first element selected from the group consisting of bismuth and antimony and at least one second element selected from the group consisting of tellurium and selenium;
   b) cooling said molten thermoelectric alloy at a quenching velocity ranging from $10^{4°}$ K per second to $10^{6°}$ K per second so as to solidify said thermoelectric alloy;
   c) powderizing the solidified thermoelectric alloy; and
   d) shaping the powder of said thermoelectric alloy into a configuration by sintering at a temperature lower than a temperature for recrystallization of said thermoelectric alloy.

9. The process as set forth in claim 8, in which said quenching velocity is achieved by using a melt quenching technique.

10. A process of manufacturing a thermoelectric element, comprising the steps of:
    a) preparing a molten thermoelectric alloy expressed by the composition formula of $Bi_{0.5}Sb_{1.5}Te_3$;
    b) rapidly cooling said molten thermoelectric alloy by using a melt quenching technique at $10^4$ to $10^{6°}$ K/second so as to produce laminae of said thermoelectric alloy;
    c) powderizing said laminae into a powder of 4.4 microns in mean diameter; and
    d) shaping the powder of said thermoelectric alloy into said thermoelectric element by hot pressing under pressure of 8000 kgf/cm$^2$ at 450 degrees centigrade for 10 minutes.

11. A process of manufacturing a thermoelectric element, comprising the steps of:
    a) preparing a molten thermoelectric alloy expressed by the composition formula of $Bi_{0.5}Sb_{1.5}Te_3$;
    b) rapidly cooling said molten thermoelectric alloy by using a melt quenching technique at $10^4$ to $10^{6°}$ K/second so as to produce laminae of said thermoelectric alloy;
    c) powderizing said into a powder of 1.2 microns in mean diameter; and
    d) shaping the powder of said thermoelectric alloy into said thermoelectric element by hot pressing under pressure of 8000 kgf/cm$^2$ at 350 degrees centigrade for 80 minutes.

* * * * *